United States Patent
Smith et al.

(10) Patent No.: US 6,194,123 B1
(45) Date of Patent: Feb. 27, 2001

(54) MANUFACTURING METHOD FOR COLOR PROOFING ELEMENTS

(75) Inventors: Gordon Christopher Smith, Des Plaines, IL (US); Hamid Barjesteh, Woodbury; James Alan Bonham, Lake Elmo, both of MN (US)

(73) Assignee: Minnesota Mining and Manufacturing Company, St. Paul, MN (US)

( * ) Notice: Subject to any disclaimer, the term of this patent is extended or adjusted under 35 U.S.C. 154(b) by 0 days.

(21) Appl. No.: 09/310,824

(22) Filed: May 12, 1999

Related U.S. Application Data

(62) Division of application No. 08/862,803, filed on May 23, 1997, now Pat. No. 6,010,821.

(51) Int. Cl.$^7$ .............................. G03F 7/038; G03F 7/11; G03F 7/075
(52) U.S. Cl. .................. 430/273.1; 430/920; 430/287.1; 430/283.1; 430/285.1; 430/271.1; 522/39; 522/50; 522/63
(58) Field of Search ................................ 430/287.1, 920, 430/283.1, 273.1, 285.1; 522/39, 50, 63

(56) References Cited

U.S. PATENT DOCUMENTS

| | | | |
|---|---|---|---|
| 3,495,987 | 2/1970 | Moore | 96/115 |
| 3,617,288 | 11/1971 | Hartman et al. | 96/90 |
| 3,640,718 | 2/1972 | Smith | 96/89 |
| 3,954,475 | 5/1976 | Bonham et al. | 96/97 |
| 3,987,037 | 10/1976 | Bonham et al. | 260/240 D |
| 4,041,204 | 8/1977 | Hepher et al. | 428/199 |
| 4,189,323 | 2/1980 | Buhr | 430/281.1 |
| 4,239,850 | 12/1980 | Kita | 430/281.1 |
| 4,259,432 | 3/1981 | Kondoh et al. | 430/281.1 |
| 4,408,532 | 10/1983 | Incremona | 101/456 |
| 4,505,793 | 3/1985 | Tamoto et al. | 430/141 |
| 4,551,408 | 11/1985 | Mino et al. | 430/141 |
| 4,696,888 | 9/1987 | Buhr | 430/270.1 |
| 4,772,534 | 9/1988 | Kawamura et al. | 430/176 |
| 4,826,753 | 5/1989 | Higashi et al. | 430/281.1 |
| 4,837,128 | 6/1989 | Kawamura et al. | 430/281.1 |
| 4,885,225 | 12/1989 | Heller et al. | 430/160 |
| 4,997,745 | 3/1991 | Kawamura et al. | 430/281.1 |
| 5,034,526 | 7/1991 | Bonham et al. | 544/209 |
| 5,054,435 | 10/1991 | Adams et al. | 430/288.1 |
| 5,116,977 | 5/1992 | Rossman et al. | 544/113 |
| 5,204,221 | 4/1993 | Muramoto et al. | 430/281.1 |
| 5,268,397 | 12/1993 | Larson | 522/97 |
| 5,310,618 | 5/1994 | Kawamura | 430/157 |
| 5,348,834 | 9/1994 | Wanat | 430/143 |
| 5,374,501 | 12/1994 | Holmes et al. | 430/273.1 |
| 5,429,903 | 7/1995 | Wanat | 430/162 |
| 5,443,937 | 8/1995 | Bodager et al. | 430/143 |
| 5,455,143 | 10/1995 | Ali | 430/281.1 |
| 5,484,919 | 1/1996 | Bonham | 544/193.1 |
| 5,489,499 | 2/1996 | Yumoto | 430/281.1 |
| 5,496,504 | 3/1996 | Bonham et al. | 252/600 |

FOREIGN PATENT DOCUMENTS

| | | |
|---|---|---|
| 0529789 | 3/1993 | (EP) . |
| 0530962 | 3/1993 | (EP) . |
| 0 546 768 A1 | 6/1993 | (EP) . |
| 0 666 504 A1 | 8/1995 | (EP) . |
| 0740208 | 10/1996 | (EP) . |
| 1 463 900 | 2/1977 | (GB) . |
| 63-298339 | 12/1988 | (JP) . |
| 6-167808 | 6/1994 | (JP) . |
| WO 97/00464 | 1/1997 | (WO) . |

OTHER PUBLICATIONS

English Abstract of JP6–222558 dated Aug. 12, 1994.
English Abstract of JP7–134411 dated May 23, 1995.
English Abstract of JP60198535 dated Oct. 8, 1985.
English Abstract of JP62–22555 A dated Aug. 12, 1994.

*Primary Examiner*—Cynthia Hamilton

(57) ABSTRACT

Water coatable and water developable negative-acting color proofing single sheet and overlay systems are described. The water-soluble photosensitive color layer employed in each type of proofing construction includes a photopolymerizable polymer having a weight-average molecular weight between 5,000 and 100,000; an alkaline soluble resin having a weight-average molecular weight between 1,000 and 200,000 and an acid number between 50 and 300; and a water-soluble photoinitiator.

20 Claims, No Drawings

MANUFACTURING METHOD FOR COLOR PROOFING ELEMENTS

This application is a divisional application of United States patent application Ser. No. 08/862,803 filed May 23, 1997 now U.S. Pat. No. 6,010,821.

FIELD OF THE INVENTION

This invention relates to aqueous developable pre-sensitized color proofing elements. In particular, this invention relates to negative-acting overlay and single sheet color proofing elements that are manufactured using aqueous coating compositions and developed with an aqueous developer, thus providing an environmentally friendly color proofing system.

BACKGROUND

In color reproduction, the color accuracy of graphic art color separation negatives are generally verified using color proofing systems prior to making the corresponding printing plates. The color proofing systems must provide a consistent representation of the final color print. It is well known in the art that the halftone dot retention plays a significant role in the color rendition of the final image. Slight changes in the dot reproduction curve can cause significant changes in visual color perception.

Several different types of color proofing systems are well known in the literature. Both digital and conventional proofing systems are available commercially. In digital systems, digitized data is used to directly image the color proofing materials. However, conventional proofing systems are primarily used when verifying the color accuracy of graphic art color separation films. Conventional color proofing systems consist of two types: overlay and surprint. Overlay systems provide a convenient and quick way to visualize a representative color on a transparent substrate. A typical overlay film construction includes a polyester substrate and photosensitive color layer. Optional protective layers may also be included over the surface of the photosensitive color layer. A color proof is constructed by individually imaging and developing each representative color proofing film. The color imaged films are then laid upon each other in register on a paper stock, thus providing a quick and simple color proof composite. Examples of these types of constructions may be generally found in U.S. Pat. Nos. 3,136,637; 4,304,836; 4,482,625; 4,634,652; 4,748,101; 4,952,482; and 5,258,261.

A surprint proof is generated by successively superimposing different colored layers upon each other on a single sheet. The surprint color proofing materials are composed of two primary types: photosensitive precolored sheets and photosensitive colorless sheets whose latent image may be toned with pigments, inks or dyes. Some examples of post-colored proofing materials may be found in U.S. Pat. Nos. 3,060,024; 3,634,087; and DE 3,336,431.

An example of one type of precolored proofing system includes photosensitive constructions that are imaged prior to lamination to the receptor or intermediate sheet. Representative examples of these types of systems are described in U.S. Pat. Nos. 4,482,625 and 4,304,836.

Another type of precolored proofing system includes photosensitive constructions that are imaged and developed after lamination to a receptor or intermediate sheet. For example, U.S. Pat. No. 3,671,236 describes a negative acting presensitized color proofing element comprising a carrier sheet having a smooth release surface, a diazo sensitized color layer and a non-photoactive barrier layer upon which may be coated a pressure sensitive adhesive or a thermal adhesive as described in U.S. Pat. No. 4,656,114. The developing media for this system is a 50:50 mixture of n-propanol and water. The barrier layer is present as a carrier for the image and to reduce interaction between the adhesive and the photoactive layer. U.S. Pat. Nos. 4,650,738; 4,751,166; 4,808,508; 4,929,532; and 5,008,174; EP 365,356 and EP 365,357 patent applications describe improvements on this construction by eliminating the need for a barrier layer between the diazo based photoactive layer and the adhesive. The developer used in these systems are aqueous alkali solutions containing greater than 3% surfactant.

U.S. Pat. No. 4,596,757 discloses a further improvement on the construction described in U.S. Pat. No. 3,671,236 by utilizing a photo monomer system in place of the diazonium binders. Again an aqueous alkali developer is used which contains high concentrations of a surfactant (the example cited used 8.5%).

U.S. Pat. No. 5,248,583 describes a construction which utilizes a photoactive color layer containing a photo-oligomer as the photopolymerizable component and a photopolymerizable barrier layer to provide a proofing element that can be developed in a low solids aqueous developer having a pH of 10.2. This construction allows one to develop the image using a more environmentally compatible effluent since the aqueous developer contains less caustic and less ingredients than those used in the previously described systems.

To achieve a system that is developable in a developing solution having a more neutral pH, the binders used in the photosensitive proofing formulation typically make the image more susceptible to attack by the developer. When the resistively developable image is swelled or attacked by the developer it becomes increasingly more difficult to hold the highlight dots (0.5–10% halftone dots) without sacrificing the shadow areas (90–99.5% halftone dots). The shadow areas are sacrificed when the photosensitive layer is overexposed to achieve sufficient cross-link density in the highlight dots to resist developer attack. However, when a photosensitive layer is overexposed, the shadow areas begin to fill-in due to halation effects. This over-exposure also increases the overall dot gain, which significantly affects the color rendition. Therefore, there exists a need for a proofing system that maintains highlight halftone dots without over-exposure and is developable in an aqueous developer having low solids and a pH less than 10.5.

Some attempts have been made to provide proofing elements that are coated out of water and developed with water. For example, U.S. Pat. No. 5,443,937 describes a photosensitive element based a photosensitive polymeric diazo resin. However, polymeric diazo resins typically generate color upon exposure to light which effects the final color of the image. In the printing industry, the color rendition of the proof is a critical factor of the proofing system. Any changes must be compensated for in the initial formulation of the color coatings. Adjustments to the formulations are a tedious task since the composition has to be coated, dried and exposed before an evaluation of the color can be performed. In addition, negative images using diazonium resins must be post exposed to light to stabilize the color. This post exposure step adds an additional step to the proof making process. Therefore, there is still a need for a water coatable and water developable color proofing element that does not have the disadvantages of color shifts due to the generation of color by the diazo resins and does not require additional process steps.

U.S. Pat. No. 4,041,204 describes a photosensitive sheet using a water coatable and aqueous developable photosensitive color layer. Even though the examples disclose the use of water to develop the image, the sheet is soaked in water for about a minute before spraying to complete the removal of the unexposed areas. In other examples, the image was developed with a 4% solution of hydrogen peroxide. Resolution is not discussed and would not be a critical issue in stencil applications.

SUMMARY OF THE INVENTION

The present invention provides both a negative-acting photosensitive overlay color proofing element and a negative-acting photosensitive single sheet color proofing element. The photosensitive elements can be manufactured using aqueous coating solutions and developed with aqueous developers. In one embodiment of the present invention, an overlay color proofing element is provided comprising a carrier having coated thereon in the following order: (a) a water-soluble photosensitive color layer comprising (i) an acrylated polymer (or oligomer) having at least one pendant acrylate group and a weight-average molecular weight between 5,000 and 100,000, (ii) an alkaline soluble resin having a weight-average molecular weight between 1,000 and 200,000 and an acid number between 50 and 300, (iii) a colorant or texturing material, and (iv) a photoinitiator; and (b) a water-soluble oxygen barrier layer. Preferred photoinitiators are water-soluble or water-dispersible photoinitiators having the following general structure:

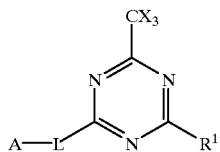

wherein X is chlorine or bromine; $R^1$ is selected from the group consisting of hydrogen, trichloromethyl, tribromomethyl, aryl, and alkyl having up to 15 carbon atoms; L is a linking group selected from the group consisting of carbamato, carbamido, amino, amido, alkyl having up to 15 carbon atoms, oxy, alkenyl, alkynyl, keto, ester, sulfonyl, aryl and combinations thereof; and A is an acid group selected from the group consisting of carboxylic acid (—$CO_2H$), sulfonic acid (—$SO_3H$), phosphonic acid (—$PO_3H$) and salts thereof Both the photosensitive color layer and the oxygen barrier layer may be coated out of water. In addition, the color proofing element may be developed with an aqueous developer having a pH between approximately 7.0 and 9.0 including ordinary tap water.

In another embodiment of the present invention, a negative-acting single sheet color proofing element is provided comprising a carrier having coated thereon in the following order: (a) a water-soluble release layer; (b) a water-soluble photosensitive color layer comprising (i) an acrylated polymer (or oligomer) having at least one pendant acrylate group and a weight-average molecular weight between 5,000 and 100,000, (ii) an alkaline soluble resin having a weight-average molecular weight between 1,000 and 200,000 and an acid number between 50 and 300, (iii) a colorant or texturing material, and (iv) a photoinitiator; (c) a water-soluble photopolymerizable inter-layer; and (d) a water-emulsion adhesive layer.

As used herein "water-soluble" or "water-dispersible" refers to materials that are soluble or dispersible in water and are capable of being readily solubilized or re-dispersed in an aqueous developer once dried into a film or coating. For simplicity, the terms "water-soluble" and "water-dispersible" will be used interchangeably. "Water-emulsion" or "latex" refers to materials which are suspended in water, but become insoluble in water once coalesced into a film or coating.

The term "texturing material" refers to materials that give the image a textured appearance. In other words, the materials give the image a dimensional quality as opposed to a uniformly flat, smooth aspect. For example, the addition of silica gives a matte or deglossed appearance.

The term "acrylated", as used herein, includes not only pendant groups based on esters of acrylic acid, but also acrylamides, methacrylates and crotonates.

DETAILED DESCRIPTION OF THE INVENTION

Water coatable and water developable negative-acting color proofing single sheet and overlay systems are described. The water-soluble photosensitive color layer employed in each type of proofing construction includes a photopolymerizable polymer having a molecular weight between 5,000 and 100,000; an alkaline soluble resin having a molecular weight between 1,000 and 200,000 and an acid number between 50 and 300; and a water-soluble photoinitiator.

The overlay construction generally comprises a carrier having coated thereon: (a) a water-soluble photosensitive color layer; and (b) a water-soluble oxygen barrier layer. When the imaged element is developed with an aqueous developer, the unexposed areas of the photosensitive coating are removed and the cross-linked image remains on the carrier. The imaged elements are then overlaid upon each other in register to form a composite multi-colored proof which may be mounted on any receptor.

Preferably, the carrier is a dimensionally and chemically stable plastic sheet, more preferably a 2.0 to 3.0 mil (5.1 to 7.6 cm) polyester film. To assist in the handling of the films, it may be desirable to include an antistatic coating, such as the antistatic coating comprising a colloidal silica crosslinked with an ambifunctional silane coupling agent described in U.S. Pat. No. 5,344,751. In addition, an anti-reflection coating(s), such as those described in U.S. Pat. Nos. 4,340,276; 4,634,652; and 4,748,101, may also be included in the construction to reduce the interference patterns when viewing the composite proof The overlay construction includes an oxygen barrier layer applied over the photosensitive color coating. Additives may be incorporated into the oxygen barrier layer to impart other desirable properties. For example, the oxygen barrier layer may contain particulates, such as polymeric beads or silica to assist in vacuum draw-down in the exposure frame and improve handling properties, or anti-halation materials to improve resolution, or UV absorbers to balance exposure times of the various colors. The oxygen barrier layer must be capable of being removed during development of the image. Preferred oxygen barrier layers include water soluble resins, such as alkyl ethers of cellulose, polyvinyl alcohols and polyvinyl pyrrolidone.

The negative-acting single sheet color proofing element generally comprises a carrier having coated thereon in the following order: (a) a water-soluble release layer; (b) a water-soluble photosensitive color; (c) a water-soluble photopolymerizable inter-layer; and (d) a water-emulsion adhesive layer.

The carrier sheet is coated with a water-soluble release layer which functions both as a releasable coating and an oxygen barrier. The function of the release layer is to serve as a parting layer between the carrier sheet and the photosensitive color coating layer. The release layer remains in contact with the photosensitive color layer when the carrier is removed. The release layer acts as an oxygen barrier to prevent oxygen inhibition of the photopolymerization of the photopolymers in the photosensitive color layer during the imaging process. The preferred material for use in the present invention is a 1.5 to 2.0 mil (3.7 to 5.6 cm) polyester film provided with a release layer comprising a cellulose methyl ether, polyvinylpyrolidone or polyvinyl alcohol resin. The release properties of the release layer may be adjusted by the addition of surfactants. Preferred surfactants include alkylarylpolyether alcohols, such as Triton™ X-100 (octylphenoxy ethanol, available from Rohm & Haas, Philadelphia, Pa.), glycerin and ethoxylated castor oil. In the preferred embodiment, the surfactant is present in the release layer at about 0.1 to 5% by weight of solids in the layer, more preferably 0.5 to 2%. Other ingredients may be added such as mold inhibitors, anti-halation dyes, filter dyes, solvents, wetting agents, etc. Additionally, the carrier may have a smooth or textured surface and may also include colorants or UV absorbers.

A photosensitive color layer is coated onto the releasable surface of the carrier. This layer typically comprises a crosslinkable acrylated polymer (or oligomer), an alkaline soluble resin, a colorant or texturing material and a photoinitiator. The preferred crosslinkable acrylated polymers have a weight-average molecular weight between 5,000 and 100,000, and contain at least one pendant unsaturated acrylate group . Acrylated polymers having this molecular weight range are usually insoluble in water and are supplied commercially as latexes or water emulsions. Even though the acrylic latexes and emulsions may form water insoluble coatings when used alone, it has been discovered that a water-dispersible photosensitive color layer is formed when combined with alkaline soluble resins. Suitable acrylated polymers or oligomers include acrylated urethanes, acrylated acrylics, acrylated epoxies, aminoplast derivatives having pendant alpha, beta unsaturated carbonyl groups, isocyanurate derivatives having at least one pendant acrylate group, isocyanate derivatives having at least one pendant acrylate group, acrylated polyesters, and mixtures thereof. Suitable commercially available materials include E-3120 crosslinkable acrylic latex (available from Rohm and Haas, Philadelphia, Pa.), Neorad™ 440 crosslinkable acrylic polymer water-emulsion (available from ICI/Zeneca Resins, Wilmington, Mass.), Neorad™ 3709 crosslinkable polyurethane acrylic water-emulsion (available from ICI/Zeneca Resins) and Sancure™ 850 crosslinkable acrylic water-emulsion (available from B. F. Goodrich, Cleveland, Ohio). Aqueous acrylic polymer emulsions, latexes or dispersions are generally referred to as particles or droplets of acrylate polymer suspended in water, preferably with the aid of a dispersing agent. In the practice of the present invention, the particle size of the emulsion or latex is preferably between 10 and 10,000 nm, more preferably between 10 and 100 nm.

An alkaline soluble resin is added to the photosensitive color layer to control developablility of the layer. Suitable resins include polyvinyl acetate/crotonic acid copolymers, styrene maleic anhydride half ester resins (i.e., Joncryl™ 91 or 142, available from Johnson Wax, Racine, Wis.), polyvinyl alcohols, polyvinyl pyrollidones, and acid modified polyvinyl butyral resins (i.e., condensation products of polyvinyl butyral with succinic anhydride in the presence of triethylamine). The molecular weight and acid number of the alkaline soluble resin will vary depending upon the particular photopolymerizable acrylic polymer used in the formulation. If the molecular weight is too low and/or the acid functionality too high, then the imaged or cured portion of the photosensitive layer may be attacked by the developer resulting in density loss, uneven development around the fringes of the halftone dots, or complete loss of the highlight dots. On the other hand, if the molecular weight is too high and/or the acid functionality too low, then the non-imaged portions of the photosensitive layer may not be removed by the developer, resulting in loss of resolution in the shadow areas of the proof (90–99.5% dots) or background staining. The strength of the developer can be increased in this particular situation to assist in the removal of the layer; however, this may lead to loss of the highlight dots. Preferred alkaline soluble resins have a weight-average molecular weight between 1,000 and 200,000 and an acid number between 50 and 300.

In a preferred embodiment, the photoinitiator(s) used preferably does not generate a visible color change in the image or adhesive layers after exposure. Examples of suitable photoinitiators include; halomethyl-1,3,5-triazines, acetophenones, benzophenones, iodonium salts, and thioxanthones. Preferred photoinitiators are water-soluble or water-dispersible. Suitable photoinitiators include water soluble Michelor's ketone, Irgacure™ 2959 (available from Ciba-Geigy, Hawthorne, N.Y.), Quantacure™ ABQ or Quantacure™ QTX (both available from Biddle Sawyer, New York, N.Y.), and water-soluble trihalomethyl-1,3,5-triazines. Halomethyl-1,3,5-triazines having an aromatic or aliphatic sulfonic acid group or salt thereof are particularly useful. Examples of suitable water-soluble trihalomethyl-1,3,5-triazines are described in co-pending U.S. patent application Bonham, J., titled "Ionic Halomethyl-1,3,5-Triazine Photoinitiators" filed on May 23, 1997 (FN# 52333USA7A) now U.S. Pat. No. 5,847,133, incorporated herein by reference, and have the following general structure:

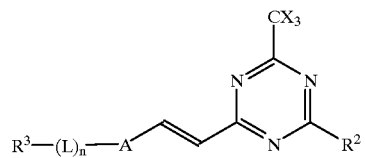

wherein X is chlorine or bromine; A is an aryl group having 1 to 3 rings; L is a linking group selected from the group consisting of carbamato, carbamido, amino, amido, alkyl having up to 15 carbon atoms, oxy, alkenyl, alkynyl, keto, ester, sulfonyl, aryl, and combinations thereof, n is 0 or 1; $R^3$ is an acid group selected from the group consisting of sulfonic acid, carboxylic acid, phosphonic acid and salts thereof, and $R^2$ is —$CX_3$, —$NH_2$, NHR, —$NR_2$, —OR, or —R, where R is selected from the group consisting of an alkyl group having up to 15 carbon atoms, an aryl group having up to three rings, a heterocyclic aromatic group, and combinations thereof. A preferred water-soluble photoinitiator is the reaction product of 2,4-bis(trichloromethyl)-6-[3-(2-hydroxyethoxy)styryl]-1,3,5-triazine with 2-sulfobenzoic acid cyclic anhydride.

Other examples of useful water-soluble trihalomethyl-1,3,5-triazines are described in JP 63-298339 which include trihalomethyl-1,3,5-triazines having the following general structure:

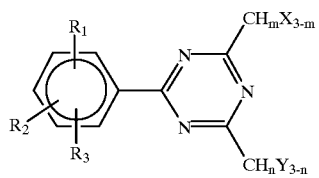

where $R_1$ is a carboxylate group, a sulfonate group, an alkyl group, or an alkyl substituted amino group; $R_2$ and $R_3$ are each hydrogen, carboxylate group, sulfonate group, alkyl group, or alkyl substituted amino group which may be the same or different with each other; X and Y are each chlorine or bromine; and m and n are each 0, 1, or 2.

The photoinitiators may be used singly or in combination with each other. The optimum amount of initiator will be dependent upon the oligomer type used and the filtering effect of the pigment used; however, the initiator is usually present in concentrations of about 1.0–15% by weight of the photosensitive composition. When triazines are used as the photoinitiator, the photosensitive color coating solution is preferably less than a pH of 7.5. Some triazine initiators have a tendency to decompose in alkaline environments. In preparing the photosensitive color coating solution, the triazine is added last so that the pH of the coating solution may be adjusted to below 7.5 (if necessary) before adding the triazine. If the pH of the solution is to high, the pH of the solution is decreased by adding an acid (e.g., HCl) before adding the triazine initiator.

Pigments or dyes may be used as colorants in the photosensitive color layer. However, pigments or polymeric dyes are preferred since they have a lower tendency for migration between the layers. Pigments are more preferred due to the wide variety of colors available and lower cost. Pigments are generally introduced into the photosensitive formulation in the form of a millbase comprising the pigment dispersed with a binder and suspended into water with the aid of a dispersant. The dispersion process may be accomplished by a variety of methods well known in the art, such as two-roll milling, three-roll milling, sand milling, ball milling, etc. Many different pigments are available and are well known in the art. The pigment type and color are chosen such that the coated color proofing element is matched to a preset color target or specification set by the industry. Color enhancing additives may be used which include fluorescent, pearlescent, iridescent, and metallic materials. Texturing materials such as silica, polymeric beads, reflective and non-reflective glass beads, or mica may also be added in place of a colorant to provide an image with a textured appearance. The color enhancing additives or texturing materials may be used either alone or in combination with the above pigments to produce proofs with the desired visual effects.

The type of dispersing resin and the pigment to resin composition ratio chosen are dependent upon the pigment type, surface treatment on the pigment, dispersing solvent and milling process. Some examples of resins suitable for generating millbases which are compatible with the aforementioned photo-oligomers and monomers include; polyvinyl acetate/crotonic acid copolymers, styrene/maleic anhydride partial-ester resins, acid containing acrylic and methacrylic polymers and copolymers, polyvinyl acetals, polyvinyl acetals modified with anhydrides and amines, hydroxy alkyl cellulose resins, acrylic resins having pendant quaternary ammonium and/or alkyl hydroxy groups and styrene/acrylic/acrylic acid resins. The dispersion may contain a mixture of these resins. The pigment to resin ratio in the dispersion is typically between 0.6 to 5.0, preferably between 0.8 to 3.0. Preferred commercially available aqueous pigment dispersions include Sunsperse™ aqueous dispersions available from Sun Chemical, Cincinnati, Ohio.

A dispersing agent may be necessary to achieve optimum dispersion quality. Some examples of dispersing agents include; polyester/polyamine copolymers, alkylarylpolyether alcohols, acrylic resins and Disperbyk™ wetting agents available from Byk-Chemie USA, Wallingford, Conn. Other components may also be included in the millbase such as surfactants to improve solution stability, fluorescent materials, optical brighteners, UV absorbers, fillers, etc.

Additional binders may also be included in the photosensitive color formulation to balance developability and tack for each color. The coating weights of the individual colors may vary in order to achieve the preset color target. The color formulations are adjusted to achieve optimum color, resolution, exposure speed and developability. Typical dry color coating weights are between 50 mg/ft² and 150 mg/ft² (0.54 g/m² and 1.61 g/m²), preferred 60 mg/ft² and 90 mg/ft² (0.65 g/m² and 0.97 g/m²).

Coated adjacent to the photosensitive color layer is a photopolymerizable inter-layer. The inter-layer may be the same solution used for the photosensitive color layer without the colorant or it may be any photopolymerizable composition that is soluble in water and rendered insoluble in water upon exposure to ultraviolet radiation. The photopolymerizable inter-layer is present to prevent interaction between the color layer and the adhesive, and also improves developability of the non-image areas. The inter-layer typically comprises an photopolymerizable ethylenically unsaturated compound, an acidic binder and a photoinitiator. Basically the same materials as those described for the photosensitive color layer may be used in the inter-layer. The ethylenically unsaturated compound is present at about 50–80% by weight of the total inter-layer composition. Preferred binders include; polyvinyl acetate/crotonic acid copolymers, styrene/maleic anhydride partial-ester resins, acid containing acrylic and methacrylic polymers and copolymers, acidified polyvinyl acetals, and styrene/acrylic/acrylic acid resins. The acidic binder or resin is present at about 15–50% by weight of the total inter-layer composition. The initiator is present at 0–10% by weight of the total inter-layer composition. The addition of photoinitiator may be unnecessary depending upon the extent upon which the inter-layer intermixes with the adjacent photosensitive color layer. The inter-layer is coated to a dry coating weight of about 0.15 to 2.0 g/m², preferably about 0.2 to 1.0 g/m².

Coated adjacent to the photopolymerizable inter-layer is a water insoluble adhesive layer. The adhesive layer provides a means of laminating the color proofing element to a temporary or permanent substrate under heat and pressure. Examples of adhesive coating solvents include alcohols, water and hydrocarbon solvents. Because hydrocarbon solvents like heptane and naphtha are prone to irregular coating patterns, due primarily to static, more polar solvents such as water and alcohols are preferred, more preferably wateremulsions or latexes. The adhesive is preferably a thermally activated adhesive that is softenable at a temperature of less than 200° C., preferably within a range between 100° C. and 160° C. In contrast with the softening characteristics of the adhesive, it is desirable that the adhesive not block during storage or shipment. Resins having a Tg between 45° C. and 60° C., including copolymers and terpolymers of alkyl acrylate, alkyl methacrylate, styryl, and acrylamide monomers, meet both the lamination criteria and avoid the potential for blocking, without requiring the use of an additional protective liner. Useful resins include polymers, copolymers and terpolymers of methyl methacrylate, n-butyl methacrylate, n-butyl/isobutyl methacrylate, vinylacetates, N-(hydroxymethyl) acrylamide and styrenes. Vinyl acetate polymers have been found to be very sensitive to moisture and can cause blocking of the coated materials in shipment and storage if the vinyl acetate component of the adhesive is present in amounts greater than 20%. Other additives may be present to aid in coating and performance such as surfactants, coalescent aids, plasticizers, slip agents (i.e., polymethacrylate beads like those described in U.S. Pat. No. 4,885,225, silica, polyethylene waxes), optical brighteners, UV absorbers, etc.

A multi-colored proof is made by laminating a color proofing element onto a receptor. The carrier may be removed either prior to exposure or prior to the development step. The laminated structure is imaged through a negative color separation graphic art film corresponding to the color of the proofing element to create a latent image. The spectral and power output of the exposure unit and the absorption of the photoinitiator system are chosen for an optimum exposure speed. Typical exposure units are equipped with UV lamps having optimum spectral outputs between 250 nm and 500 nm and a power output between 2.5 and 10 Kilowatts. The exposed laminated structure is then developed with an aqueous developer. The process of laminating, exposing and developing is then repeated using a different color until the desired multi-colored composite proof is complete. A non-colored or textured image may be added if so desired by laminating, exposing and developing a proofing element whose photosensitive layer contains texturing materials such as those described earlier in place of or in addition to a colorant.

The receptor may be a permanent substrate. A suitable composition for the receptor sheet is a heat stable, waterproof white paper, such as Matchprint™ base (available from Imation Corp.™, Oakdale, Minn.). The receptor sheet may also be a polyester film or any other heat stable plastic material. Alternatively, the receptor may be a temporary receptor such as those described in U.S. Pat. Nos. 5,240,810; 5,192,630; and 5,094,931.

Suitable aqueous developer solutions have a pH between 7 and 9, including ordinary warm tap water. When tap water is used, it may be necessary to add a water conditioner, a water soluble surfactant or other additives to compensate for the variations in the quality of the water. If the water contains high levels of minerals, it may also be necessary to pre-filter the water through a commercial water filtering system. It may be desirable to buffer the developer to a specific pH by adding a combination of sodium or potassium carbonate, and sodium or potassium bicarbonate. Preferred buffered solutions contain about 0.5–2.0% by weight of carbonate, about 0–1.0% by weight of bicarbonate, and about 0.1–1.0% by weight of a surfactant dissolved in water. Preferred surfactants non-exclusively include; Surfynol™ 465 (ethoxylated tetramethyl decynediol, available from Air Products and Chemicals, Allentown, Pa.), Surfactol™ 365 (ethoxylated castor oil, available from CasChem Inc., Bayonne, N.J.), Triton™ X-100 (octylphenoxypolyethoxyethanol, available from Rohm and Haas, Philadelphia, Pa.), and Surfynol™ GA (acetylenic diols compounded with other non-ionic surfactants and solvents, available from Air Products and Chemicals, Allentown, Pa.).

The invention will now be illustrated in the following non-limiting examples:

EXAMPLES

Unless designated otherwise, all chemical raw materials are available from Aldrich Chemicals, Milwaukee, Wis. Sunsperse™ pigment dispersions are available from Sun Chemicals, Cincinnati, Ohio.

The following preparation describes the method for preparing the water-soluble triazine initiator referred to in the Examples.

Water-soluble Triazine Initiator

A slurry of 216.5 g (0.0.453 eq) of 2,4-bis(trichloromethyl)-6-[3-(2-hydroxyethoxy)styryl]-1,3,5-triazine in 1400 mL of toluene was prepared and the water impurity was removed by azeotropic distillation of approximately 100 ml of the solvent. After cooling to room temperature, 100 g (0.543 eq) of 2-sulfobenzoic acid anhydride (Aldrich Chemical) was added. The solution was heated to 70° C. and the reaction was complete in about 3 hrs. as determined by FTIR and TLC. After cooling to room temperature, the reaction solution was filtered to remove a small amount of a brown impurity. The filtrate was then slowly poured into a solution of 5000 mL heptane/1000 mL 2-propanol with rapid stirring at 10° C. The product precipitated and was collected by filtration. A rubber dam was used during the filtration to help remove excess solvent. After drying at 50–60° C., 247.5 g (83% yield) of a slightly yellow, deliquescent solid was collected. The product dissolved in water at a concentration of at least 10%, and was very soluble in a wide variety of organic solvents such as methanol, acetone, ethyl acetate, chloroform, and toluene. The structural formula of the product was confirmed by NMR and FTIR to be the trichloromethyltriazine compound with a sulfonic acid group illustrated below:

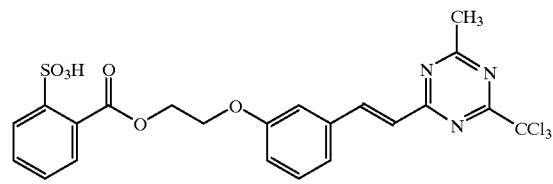

Examples 1–8

Examples 1–8 illustrate water coatable and water developable overlay negative-acting color proofing elements.

The preparation for the water-soluble oxygen barrier layer coating solution used in Examples 1–8 is described below.

| Water-Soluble Oxygen Barrier Layer Coating Solution | |
|---|---:|
| Airvol ™ 540 Polyvinyl alcohol (available from Air Products and Chemicals, Allentown, PA) | 843 g |
| Airvol ™ 205 Polyvinyl alcohol (available from Air Products and Chemicals, Allentown, PA) | 2,458 g |
| PVP K-90 (polyvinyl pyrolidone, available from GAF Chemical Corporation, Wayne, NJ) | 2,298 g |
| Kathon ™ CG/ICP Preservative (available from Rohm and Haas, Philadelphia, PA) | 5.8 g |
| Stearyl methacrylate/hexanediol diacrylate Beads | 15.0 g |
| Deionized Water | 11,379 g |

Example 1

This example illustrates a water-soluble magenta overlay construction. A magenta color solution was prepared by adding 0.5 g Sunsperse™ Red dispersion (47.1% Red 48:1 pigment in water) to 5.0 g of the following photopolymer solution.

| | |
|---|---|
| Water | 14.0 g |
| Water-Soluble Triazine initiator | 0.11 g |
| Joncryl ™ 91 (27% T.S. acrylic colloidal solution, available from Johnson Wax, Racine WI) | 0.79 g |
| E-3120 (41% T.S. UV Cross linking Latex, available from Rohm and Haas, Philadelphia, PA) | 5.07 g |

The aqueous magenta solution was coated onto a 2.65 mil (0.07 mm) polyester substrate (ICI 054 film, available from ICI Americas Inc., Wilmington, Del.) with a #12 wire wound bar and dried for 2 minutes at 93° C. (200° F.) resulting in a dry coating thickness of approximately 0.35 mils (8.9 microns). The magenta color layer was then overcoated with the oxygen barrier layer described above using a #6 wire wound bar and dried for 2 minutes at 93° C. (200° F.).

The magenta overlay element was exposed under vacuum through a UGRA plate control target (available from EMPA/UGRA, St. Gallen, Switzerland) with a UV light source having a power output of 0.15 Watt/cm$^2$. The imaged materials were developed using a buffered aqueous developer comprising 1% potassium carbonate, 1% potassium bicarbonate and 0.1% Surfynol™ 465 (ethoxylated tetramethyldecynediol surfactant, available from Air Products, Allentown, Pa.) in water. The developed image had a dot size and line resolution as small as 50 microns.

Example 2

This example illustrates a water-soluble magenta overlay construction. A magenta color solution was prepared by adding 0.5 g of Sunsperse™ Magenta dispersion (38.9% dispersion of Red 122 Quindo Magenta pigment in water) to 5.0 g of the following photopolymer solution.

| | |
|---|---|
| Water | 14.0 g |
| Water-Soluble Triazine Initiator | 0.11 g |
| Joncryl ™ 91 (acrylic colloidal solution) | 1.39 g |
| Neorad ™ 440 (UV Cross linking dispersed polymer, available from ICI/Zeneca Resins, Wilmington, Mass.) | 3.80 g |

The aqueous magenta solution was coated onto a 2.65 mil (0.07 mm) ICI 054 polyester substrate with a #6 wire wound bar and dried for 2 minutes at 93° C. (200° F.) resulting in a dry coating thickness of approximately 0.35 mils (8.9 microns). The magenta color layer was then overcoated with the oxygen barrier layer described above using a #6 wire wound bar and dried for 2 minutes at 93° C. (200° F.).

The magenta overlay color proofing element was exposed under vacuum through a UGRA plate control target with a UV light source having a power output of 0.15 Watt/cm$^2$. The imaged materials were developed using the same buffered aqueous solution described in Example 1. The developed image had a dot size and line resolution as small as 50 microns.

Example 3

This example illustrates a water-soluble cyan overlay construction. A cyan color solution was prepared by adding 0.25 g of Sunsperse™ Blue dispersion (51.1% dispersion of 15:3 Phthalo Blue pigment in water) to 5.0 g of the photopolymer solution described in Example 2. The aqueous cyan solution was coated onto a 2.65 mil (0.07 mm) ICI 054 polyester substrate with a #6 wire wound bar and dried for 2 minutes at 93° C. (200° F.) resulting in a dry coating thickness of approximately 0.35 mils (8.9 microns). The cyan color layer was then overcoated with the oxygen barrier layer described above using a #6 wire wound bar and dried for 2 minutes at 93° C. (200° F.).

The cyan overlay color proofing element was exposed under vacuum through a UGRA plate control target with a UV light source having a power output of 0.15 Watt/cm$^2$. The imaged materials were developed using the same buffered aqueous solution described in Example 1. The developed image had a dot size and line resolution as small as 50 microns.

Example 4

This example illustrates a water-soluble black overlay construction. A black color solution was prepared by adding 0.46 g of Sunsperse™ Black dispersion (49.1% dispersion of Carbon Black 7 pigment in water with a pH of 8–9) to 10.0 g of the photopolymer solution described in Example 2. The aqueous black solution was coated onto a 2.65 mil (0.07 mm) ICI 054 polyester substrate with a #6 wire wound bar and dried for 2 minutes at 93° C. (200° F.) resulting in a dry coating thickness of approximately 0.35 mils (8.9 microns). The black color layer was then overcoated with the oxygen barrier layer described above using a #6 wire wound bar and dried for 2 minutes at 93° C. (200° F.).

The black overlay color proofing element was exposed under vacuum through a UGRA plate control target with a UV light source having a power output of 0.15 Watt/cm$^2$. The imaged materials were developed using the same buffered aqueous solution described in Example 1. The developed image had a dot size and line resolution as small as 50 microns.

Example 5

A magenta color solution was prepared by first mixing 9.41 g of Sunsperse™ Red dispersion (47.1% Red 48:1 pigment in water), 0.25 g of Sunsperse™ Yellow (47.9% Yellow 14 pigment in water) and 0.25 g of Sunsperse™ Yellow (33.0% Yellow 13 pigment in water). Under light agitation, 75.42 g of deionized water followed by 19.51 g of Neorad™ 440 and 3.25 g of Joncryl™ 142 was added. The pH measured approximately 6.9 to 7.2. Finally, 51.92 g of a 1% solution of water-soluble triazine initiator was added to the colored solution. The aqueous magenta solution was extrusion coated onto a 2.65 mil (0.07 mm) ICI 054 polyester substrate and dried at 93° C. (200° F.) resulting in a dry coating weight of 0.65 g/m$^2$ (60 mg/ft$^2$). The magenta color layer was then overcoated with the oxygen barrier coating solution described above and dried at 93° C. (200° F.) resulting in a dry coating weight of 0.54 g/m$^2$ (50 mg/ft$^2$).

The magenta overlay construction was exposed under vacuum through a UGRA plate control target with a UV light source having a power output of 0.15 Watt/cm$^2$. The imaged materials were developed using a buffered aqueous developer comprising 1% potassium carbonate, 1% potassium bicarbonate and 0.1% Surfynol™ 465 (ethoxylated tetramethyldecynediol surfactant, available from Air Products, Allentown, Pa.) in water. The resultant image resolved 1% highlight halftone dots and 99% shadow halftone dots.

The imaged materials were also developed in a 2.6% by weight aqueous solution of Triton™ X-100 in water at 80° F. The resultant image resolved 2% highlight halftone dots and 98% shadow halftone dots using a 150 lpi UGRA target.

Example 6

A cyan color solution was prepared by first mixing 4.13 g of Sunsperse™ Blue dispersion (51.1 % Blue 15:3 pigment in water), 5.12 g of Sunsperse™ Blue dispersion (50.9% Blue 15 pigment in water), and 0.39 g of Sunsperse™ Yellow dispersion (33.0% Yellow 83 pigment in water). Under light agitation, 60.08 g of deionized water followed by 23.58 g of Neorad™ 440 and 3.93 g of Joncryl™ 142 was added. The pH measured approximately 6.8 to 7.2. Finally, 62.76 g of a 1% solution of water-soluble triazine initiator was added to the colored solution. The aqueous cyan solution was extrusion coated onto a 2.65 mil (0.07 mm) ICI 054 polyester substrate and dried at 93° C. (200° F.) resulting in a dry coating weight of 0.86 g/m$^2$ (80 mg/ft$^2$). The cyan color layer was then overcoated with the oxygen barrier coating solution described above and dried at 93° C. (200° F.) resulting in a dry coating weight of 0.54 g/m$^2$ (50 mg/ft$^2$).

The cyan overlay construction was exposed under vacuum through a UGRA plate control target with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The resultant image resolved 1% highlight halftone dots and 99% shadow halftone dots.

The imaged materials were also developed in a 2.6% by weight aqueous solution of Triton™ X-100 in water at 80° F. The resultant image resolved 2% highlight halftone dots and 98% shadow halftone dots using a 150 lpi UGRA target.

Example 7

A yellow color solution was prepared by first charging 3.93 g of Sunsperse™ Yellow dispersion (33.0% Yellow 83 pigment in water) into a mixing vessel. Under light agitation, 101.92 g of deionized water followed by 14.15 g of Neorad™ 440 and 2.36 g of Joncryl™ 142 was added. The pH measured approximately 6.8 to 7.2. Finally, 37.66 g of a 1% solution of water-soluble triazine initiator was added to the colored solution. The aqueous yellow solution was extrusion coated onto a 2.65 mil (0.07 mm) ICI 054 polyester substrate and dried at 93° C. (200° F.) resulting in a dry coating weight of 0.65 g/m$^2$ (60 mg/ft$^2$). The yellow color layer was then overcoated with the oxygen barrier coating solution described above and dried at 93° C. (200° F.) resulting in a dry coating weight of 0.54 g/m$^2$ (50 mg/ft$^2$).

The yellow overlay construction was exposed under vacuum through a UGRA plate control target with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The resultant image resolved 1% highlight halftone dots and 99% shadow halftone dots.

Example 8

A black color solution was prepared by first charging 7.63 g of Sunsperse™ Black dispersion (49.1% Black 7 pigment in water) into a mixing vessel. Under light agitation, 43.47 g of deionized water followed by 25.05 g of Neorad™ 440 and 4.86 g of Joncryl™ 142 was added. The pH measured approximately 6.8 to 7.2. Finally, 88.99 g of a 1% solution of water-soluble triazine initiator was added to the colored solution. The aqueous black solution was extrusion coated onto a 2.65 mil (0.07 mm) ICI 054 polyester substrate and dried at 93° C. (200° F.) resulting in a dry coating weight of 0.97 g/m$^2$ (go mg/ft$^2$). The black color layer was then overcoated with the oxygen barrier coating solution described above and dried at 93° C. (200° F.) resulting in a dry coating weight of 0.54 g/m$^2$ (50 mg/ft$^2$).

The black overlay construction was exposed under vacuum through a UGRA plate control target with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The resultant image resolved 1% highlight halftone dots and 99% shadow halftone dots.

The imaged materials were also developed in a 2.6% by weight aqueous solution of Triton™ X-100 in water at 80° F. The resultant image resolved 2% highlight halftone dots and 98% shadow halftone dots using a 150 lpi UGRA target.

Examples 9–12

Examples 9–12 illustrate water coatable and water developable single sheet color negative-acting proofing elements.

The following preparations describe methods for preparing coating solutions used in Examples 9–12.

| Water-Soluble Release Layer Coating Solution | |
|---|---|
| Airvol ™ 540 Polyvinyl alcohol (available from Air Products and Chemicals, Allentown, PA) | 843 g |
| Airvol ® 205 Polyvinyl alcohol (available from Air Products and Chemicals, Allentown, PA) | 1,458 g |
| PVP K-90 (polyvinyl pyrrolidone, available from GAF Chemicals Corporation, Wayne, NJ) | 2,298 g |
| Kathon ™ CG/ICP Preservative (available from Rohm and Haas, Philadelphia, PA) | 5.8 g |
| Deionized Water | 11,379 g |

| Water-Emulsion Adhesive Coating Solution | |
|---|---|
| Synthemul ™ R-97603 (terpolymer of N-(hydroxymethyl) acrylamide/butyl acrylate/methyl methacrylate, available from Reichhold Chemicals Inc., Dover, DE; 45% total solids in water) | 13,511 g |
| Deionized Water | 4320 g |
| Tetronic ™ 701 (alkoxylated amine non-ionic surfactant, available from BASF Corporation, Parsippany, NJ) | 16 g |
| 10.5 Micron Polymethyl methacrylate beads (prepared as described in U.S. Pat. No. 2,701,245) | 22 g |
| Daxad ™ 11KLS Dispersant (potassium salt of polymerized naphthalene sulfonic acid, available from W.R. Grace, Lexington, Mass.) | 1.3 g |

Example 9

This example describes a water developable magenta single sheet color proofing element. The release coating solution described above was coated onto 2 mil (0.051 mm) polyester film using a #12 wire wound bar and dried for 2 minutes at 93° C. (200° F.). A magenta color solution was prepared by adding 0.25 g of Sunsperse™ Red dispersion (47.1% Red 48:1 pigment in water) to 5.0 g of the following photopolymer A solution.

| Photopolymer A solution | |
| --- | --- |
| Water | 22.31 g |
| Water-Soluble Triazine Initiator | 0.16 g |
| Joncryl ™ 91 (acrylic colloidal solution) | 2.09 g |
| E-3120 (UV Cross linking Latex) | 5.44 g |

The magenta color solution was coated onto the release layer using a #6 wire wound bar and dried for 2 minutes at 93° C. (200° F.). The magenta color layer was then overcoated with the photopolymer A solution (without the added pigment dispersion) using a #6 wire wound bar and dried for 2 minutes at 93° C. (200° F.). The adhesive solution described above was then coated onto the photopolymer layer with a #12 wire wound bar and dried at 93° C. (200° F.).

The magenta single sheet construction was laminated onto a Matchprint™ paper base (available from Imation Corp.™, Oakdale, Minn.), the polyester removed and then exposed under vacuum through a UGRA plate control target. The materials were exposed with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The developed image had a dot size and line resolution as small as 50 microns.

Example 10

This example describes a water developable cyan single sheet color proofing element. The release coating solution described above was coated onto 2 mil (0.051 mm) polyester film using a #12 wire wound bar and dried for 2 minutes at 93° C. (200° F.). A cyan color solution was prepared by adding 0.5 g of Sunsperse™ Blue dispersion (51.1% dispersion of 15:3 Phthalo Blue pigment in water) to 10.0 g of the following photopolymer B solution.

| Photopolymer B solution | |
| --- | --- |
| Water | 14.0 g |
| Water-Soluble Triazine Initiator | 0.11 g |
| Joncryl ™ 91 (acrylic colloidal solution) | 1.39 g |
| Neorad ™ 440 (UV Cross linking dispersed polymer) | 3.80 g |

The cyan color solution was coated onto the release layer using a #4 wire wound bar and dried for 2 minutes at 93° C. (200° F.). The cyan color layer was then overcoated with the photopolymer B solution (without the added pigment dispersion) using a #4 wire wound bar and dried for 2 minutes at 93° C. (200° F.). The adhesive solution described above was then coated onto the photopolymer layer with a #10 wire wound bar and dried at 93° C. (200° F.).

The cyan single sheet construction was laminated onto a Matchprint™ paper base (available from Imation Corp.™, Oakdale, Minn.), the polyester removed and then exposed under vacuum through a UGRA plate control target. The materials were exposed with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The developed image had a dot size and line resolution as small as 50 microns.

Example 11

This example describes a water developable black single sheet color proofing element. The release coating solution described above was coated onto 2 mil (0.051 mm) polyester film using a #12 wire wound bar and dried for 2 minutes at 93° C. (200° F.). A black color solution was prepared by adding 0.5 g Sunsperse™ Black dispersion (49.1% dispersion of Carbon Black 7 pigment in water at a pH of 8–9, available from Sun Chemical, Cincinnati, Ohio) to 10.0 g of the photopolymer B solution described in Example 6. The black color solution was coated onto the release layer using a #4 wire wound bar and dried for 2 minutes at 93° C. (200° F.). The black color layer was then overcoated with the photopolymer B solution described in Example 6 (without the added pigment dispersion) using a #4 wire wound bar and dried for 2 minutes at 93° C. (200° F.). The adhesive solution described above was then coated onto the photopolymer layer with a #10 wire wound bar and dried at 93° C. (200° F.).

The black single sheet construction was laminated onto a Matchprint™ paper base (available from Imation Corp.™, Oakdale, Minn.), the polyester removed and then exposed under vacuum through a UGRA plate control target. The materials were exposed with a UV light source having a power output of 0.15 Watt/cm$^2$. The imaged materials were developed using a buffered aqueous developer comprising 1% potassium carbonate, 1% potassium bicarbonate and 0.1% Surfynol™ 465 in water. The developed image had a dot size and line resolution as small as 50 microns.

Example 12

The following example illustrates a single sheet color proofing element which is capable of being developed in a buffered aqueous developer. The following release layer coating solution was extrusion coated onto a 2.0 mil (0.051 mm) polyester substrate and dried at 93° C. (200° F.) resulting in a dry coating weight of 0.54 g/m$^2$ (50 mg/ft$^2$).

| Water-Soluble Release Layer Coating Solution | |
| --- | --- |
| PVP K-90 (polyvinyl pyrrolidone; 7.5% total solids in water) | 750.0 g |
| Deionized Water | 900.0 g |
| Surfactol ™ 365 (ethoxylated castor oil, available from CasChem Inc., Bayonne, NJ; 1.0% total solids in water) | 350.0 g |

A Cyan color solution was prepared by first mixing 4.47 g of Sunsperse™ Blue dispersion (51.1% solids Blue 15:3 pigment in water), 5.54 g of Sunsperse™ Blue dispersion (50.9% Blue 15 pigment in water), and 0.42 g of Sunsperse™ Yellow dispersion (33.0% Yellow 83 pigment in water). Under light agitation, 66.17 g of deionized water was added followed by 25.92 g of Neorad™ 440 acrylic polymer, and 4.32 g of Joncryl™ 142 acrylic resin (available from Johnson Wax, Racine, Wis.). The pH measured approximately 6.8 to 7.2. Finally, 68.97 g of a 1% aqueous solution of water-soluble triazine initiator was added to the colored solution. The aqueous cyan solution was extrusion coated over the release layer described above and dried at 93° C. (200° F.) resulting in a dry coating weight of 0.86 g/m$^2$ (80 mg/ft$^2$).

A photopolymerizable inter-layer coating solution was prepared by mixing 12.11 g of water with 1.28 g of Neorad™ 440, 0.21 g of Joncryl™ 142, and 3.39 g of a 1% aqueous solution of water-soluble triazine initiator. The inter-layer solution was then extrusion coated over the cyan color layer and dried at 93° C. (200° F.) resulting in a coating weight of 0.32 g/m$^2$ (30 mg/ft$^2$).

The Water-Emulsion adhesive coating solution described above was extrusion coated onto the inter-layer and dried at 93° C. (200° F.) resulting in a coating weight of 7.0 g/m$^2$ (650 mg/ft$^2$).

The cyan color proofing element was laminated onto a Matchprint™ paper base, the polyester removed and then exposed under vacuum through a UGRA plate control target. The materials were exposed with a UV light source having a power output of 0.15 Watt/cm². The imaged materials were developed using a developer comprising 1% potassium carbonate, 1% potassium bicarbonate and 0.1% Surfynol™ 465 (ethoxylated tetramethyldecynediol surfactant, available from Air Products) in water. The resultant image resolved 3% highlight halftone dots and 97% shadow halftone dots.

Reasonable variations and modifications are possible from the foregoing disclosure without departing from either the spirit or scope of the invention as claimed.

What is claimed:

1. A method of manufacturing a color proofing element comprising sequentially depositing the following layers onto a carrier from an aqueous vehicle:
   (a) a water-soluble or water-dispersible photosensitive color layer capable of being rendered insoluble and indispersible in an aqueous developer upon exposure to radiation, comprising:
      (1) an acrylated polymer having at least one pendant unsaturated acrylate group and a weight-average molecular weight between 5,000 and 100,000;
      (2) an alkaline soluble resin having a weight-average molecular weight between 1,000 and 200,000 and an acid number between 50 and 300;
      (3) a colorant; and
      (4) a photoinitiator; and
   (b) a water-soluble or water-dispersible oxygen barrier layer.

2. The method of claim 1 wherein said photoinitiator is a water-soluble or water-dispersible triazine photoinitiator having the general structure:

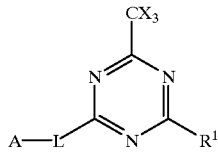

wherein:

X is chlorine or bromine;

$R^1$ is selected from the group consisting of hydrogen, trichloromethyl, tribromomethyl, aryl, and alkyl having up to 15 carbon atoms;

L is a linking group selected from the group consisting of carbamato, carbamido, amino, amido, alkyl having up to 15 carbon atoms, oxy, alkenyl, alkynyl, keto, ester, sulfonyl, aryl, and combinations thereof; and A is a group selected from sulfonic acid, carboxylic acid, phosphonic acid and salts thereof.

3. The method of claim 1 wherein said photosensitive color layer further comprises a color enhancing additive.

4. The method of claim 3 wherein said color enhancing additive is selected from the group consisting of fluorescent, pearlescent, iridescent, and metallic materials.

5. A method of manufacturing a color proofing element comprising sequentially depositing the following layers onto a carrier from an aqueous vehicle:
   (a) a water-soluble or water-dispersible photosensitive color layer capable of being rendered insoluble and indispersible in an aqueous developer upon exposure to radiation, comprising:
      (1) an acrylated polymer having at least one pendant unsaturated acrylate group and a weight-average molecular weight between 5,000 and 100,000;
      (2) an alkaline soluble resin having a weight-average molecular weight between 1,000 and 200,000 and an acid number between 50 and 300;
      (3) a texturing material; and
      (4) a photoinitiator; and
   (b) a water-soluble or water-dispersible oxygen barrier layer.

6. The method of claim 5 wherein said photoinitiator is a water-soluble or water-dispersible triazine photoinitiator having the general structure:

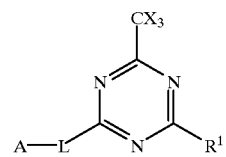

wherein:

X is chlorine or bromine;

$R^1$ is selected from the group consisting of hydrogen, trichloromethyl, tribromomethyl, aryl, and alkyl having up to 15 carbon atoms;

L is a linking group selected from the group consisting of carbamato, carbamido, amino, amido, alkyl having up to 15 carbon atoms, oxy, alkenyl, alkynyl, keto, ester, sulfonyl, aryl, and combinations thereof; and A is a group selected from sulfonic acid, carboxylic acid, phosphonic acid and salts thereof.

7. The method of claim 5 wherein said texturing material is selected from the group consisting of silica, polymeric beads, reflective glass beads, non-reflective glass beads and mica.

8. The method of claim 5 wherein the photosensitive color layer further comprises a colorant.

9. The method of claim 8 wherein the photosensitive color layer further comprises a color enhancing additive.

10. The method of claim 9 wherein the color enhancing additive is selected from the group consisting of fluorescent, pearlescent, iridescent, and metallic materials.

11. A method of manufacturing a negative-acting color proofing element comprising sequentially depositing the following layers onto a carrier from an aqueous vehicle:
   (a) a water-soluble or water dispersible release layer;
   (b) a water-soluble or water-dispersible photosensitive color layer capable of being rendered insoluble and indispersible in an aqueous developer upon exposure to radiation, comprising:
      (1) an acrylated polymer having at least one pendant unsaturated acrylate group and a weight-average molecular weight between 5,000 and 100,000;
      (2) an alkaline soluble resin having a weight-average molecular weight between 1,000 and 200,000 and an acid number between 50 and 300;
      (3) a colorant; and
      (4) a photoinitiator;
   (c) a water-soluble or water-dispersible photopolymerizable inter-layer capable of being rendered insoluble and indispersible in an aqueous developer upon exposure to radiation; and
   (d) a water-emulsion adhesive layer.

12. The method of claim 11 wherein said photoinitiator is a water-soluble or water-dispersible triazine photoinitiator having the general structure:

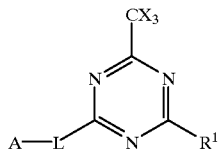

wherein:

X is chlorine or bromine;

$R^1$ is selected from the group consisting of hydrogen, trichloromethyl, tribromomethyl, aryl, and alkyl having up to 15 carbon atoms;

L is a linking group selected from the group consisting of carbamato, carbamido, amino, amido, alkyl having up to 15 carbon atoms, oxy, alkenyl, alkynyl, keto, ester, sulfonyl, aryl, and combinations thereof; and A is a group selected from sulfonic acid, carboxylic acid, phosphonic acid and salts thereof.

13. The method of claim 11 wherein said photosensitive color layer further comprises a color enhancing additive.

14. The method of claim 13 wherein said color enhancing additive is selected from the group consisting of fluorescent, pearlescent, iridescent, and metallic materials.

15. A method of manufacturing a negative-acting color proofing element comprising sequentially depositing the following layers onto a carrier from an aqueous vehicle:

(a) a water-soluble or water dispersible release layer;

(b) a water-soluble or water-dispersible photosensitive color layer capable of being rendered insoluble and indispersible in an aqueous developer upon exposure to radiation, comprising:

(1) an acrylated polymer having at least one pendant unsaturated acrylate group and a weight-average molecular weight between 5,000 and 100,000;

(2) an alkaline soluble resin having a weight-average molecular weight between 1,000 and 200,000 and an acid number between 50 and 300;

(3) a texturing material; and (4) a photoinitiator;

(c) a water-soluble or water-dispersible photopolymerizable inter-layer capable of being rendered insoluble and indispersible in an aqueous developer upon exposure to radiation; and (d) a water-emulsion adhesive layer.

16. The method of claim 15 wherein said photoinitiator is a water-soluble or water-dispersible triazine photoinitiator having the general structure:

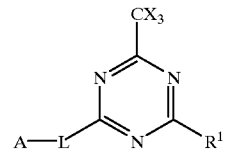

wherein:

X is chlorine or bromine;

$R^1$ is selected from the group consisting of hydrogen, trichloromethyl, tribromomethyl, aryl, and alkyl having up to 15 carbon atoms;

L is a linking group selected from the group consisting of carbamato, carbamido, amino, amido, alkyl having up to 15 carbon atoms, oxy, alkenyl, alkynyl, keto, ester, sulfonyl, aryl, and combinations thereof; and A is a group selected from sulfonic acid, carboxylic acid, phosphonic acid and salts thereof.

17. The method of claim 15 wherein said texturing material is selected from the group consisting of silica, polymeric beads, reflective glass beads, non-reflective glass beads and mica.

18. The method of claim 15 wherein the photosensitive color layer further comprises a colorant.

19. The method of claim 18 wherein the photosensitive color layer further comprises a color enhancing additive.

20. The method of claim 19 wherein the color enhancing additive is selected from the group consisting of fluorescent, pearlescent, iridescent, and metallic materials.

* * * * *